United States Patent
Shang et al.

(10) Patent No.: US 12,057,393 B2
(45) Date of Patent: Aug. 6, 2024

(54) SEMICONDUCTOR DEVICE WITH FUSE COMPONENT

(71) Applicant: NANYA TECHNOLOGY CORPORATION, New Taipei (TW)

(72) Inventors: Kai-Po Shang, Taoyuan (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 378 days.

(21) Appl. No.: 17/508,965

(22) Filed: Oct. 22, 2021

(65) Prior Publication Data

US 2023/0130975 A1 Apr. 27, 2023

(51) Int. Cl.
*H01L 23/525* (2006.01)
*H01L 27/06* (2006.01)

(52) U.S. Cl.
CPC ...... *H01L 23/5256* (2013.01); *H01L 23/5252* (2013.01); *H01L 27/0617* (2013.01); *H01L 27/0688* (2013.01)

(58) Field of Classification Search
CPC ............. H01L 23/5256; H01L 27/0688; H01L 23/5252; H01L 27/0617
See application file for complete search history.

(56) References Cited

U.S. PATENT DOCUMENTS

| | | | |
|---|---|---|---|
| 5,742,555 A * | 4/1998 | Marr | H01L 23/5252 438/467 |
| 6,740,957 B2 * | 5/2004 | Porter | H01L 23/5252 438/467 |
| 8,138,037 B2 | 3/2012 | Chudzik et al. | |
| 10,541,202 B2 * | 1/2020 | Adusumilli | H01L 23/5252 |
| 2010/0230781 A1 * | 9/2010 | Booth, Jr. | H01L 23/5252 438/467 |
| 2010/0308407 A1 * | 12/2010 | Kreipl | H10B 20/00 257/356 |
| 2011/0147853 A1 | 6/2011 | Lin et al. | |
| 2016/0379930 A1 | 12/2016 | Jain et al. | |
| 2019/0189559 A1 * | 6/2019 | Lee | G11C 17/16 |
| 2020/0212049 A1 * | 7/2020 | Lin | H10B 20/20 |
| 2022/0336350 A1 | 10/2022 | Huang | |
| 2023/0130975 A1 | 4/2023 | Shang et al. | |
| 2023/0178481 A1 | 6/2023 | Shang et al. | |
| 2023/0178482 A1 | 6/2023 | Shang et al. | |

FOREIGN PATENT DOCUMENTS

TW I634559 B 9/2018
TW 202125752 A 7/2021

OTHER PUBLICATIONS

Office Action mailed on Aug. 23, 2023 related to Taiwanese Application No. 111101531.
Office Action mailed on Sep. 13, 2023 related to U.S. Appl. No. 17/510,747.

* cited by examiner

*Primary Examiner* — Michael M Trinh
(74) *Attorney, Agent, or Firm* — Xuan Zhang

(57) ABSTRACT

A semiconductor device with a fuse component is provided. The semiconductor device includes a substrate having an active region; a fuse dielectric layer disposed in the active region; and a gate metal layer disposed in the active region and surrounded by the fuse dielectric layer. The gate metal layer is configured to receive a voltage to change a resistivity between the gate metal layer and the active region.

12 Claims, 12 Drawing Sheets

SEMICONDUCTOR DEVICE WITH FUSE COMPONENT

TECHNICAL FIELD

The present disclosure relates to a semiconductor device with a fuse component, and more particularly, to a semiconductor device with a fuse component having a three-dimensional (3D) structure.

DISCUSSION OF THE BACKGROUND

Fuses and antifuses are widely used in the fabrication of semiconductor devices, such as dynamic random access memory (DRAM) or other memory devices for fault tolerance, or used as programmable links in programmable circuits. For example, a circuit path that is initially conductive can be broken or cut off by activating (e.g., blowing, melting, etc.) a fuse. Conversely, a non-conductive circuit path may become a short circuit by activating (e.g., through breakdown, metal diffusion, transformation of properties, etc.) an antifuse.

However, antifuses may occupy a large area or footprint over semiconductor substrates. As the semiconductor devices become more highly integrated, antifuses with favorable size and breakdown conditions are required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a fuse component. The fuse component includes an active region having a surface, a fuse dielectric layer extending from the surface of the active region into the active region, and a gate metal layer surrounded by the fuse dielectric layer.

Another aspect of the present disclosure provides a semiconductor device. The semiconductor device includes an active region, a fuse dielectric layer disposed in the active region, and a gate metal layer disposed in the active region and surrounded by the fuse dielectric layer. The gate metal layer is configured to receive a voltage to change a resistivity between the gate metal layer and the active region.

Another aspect of the present disclosure provides a method of manufacturing a fuse component. The method includes an active region, forming a recess region in the active region, disposing a fuse dielectric layer in the recess region, and filling the recess region with a gate metal material.

By forming a fuse component having a three-dimensional (3D) structure, the area consumption of the fuse component of the present disclosure is increasingly reduced. The overlapping perimeter between the active region and the gate metal layer of the fuse component of the present disclosure can be increased without further occupying other areas. The longer overlapping perimeter can reduce the breakdown voltage, and therefore increases the probability of successful fusing of the fuse component of the present disclosure.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
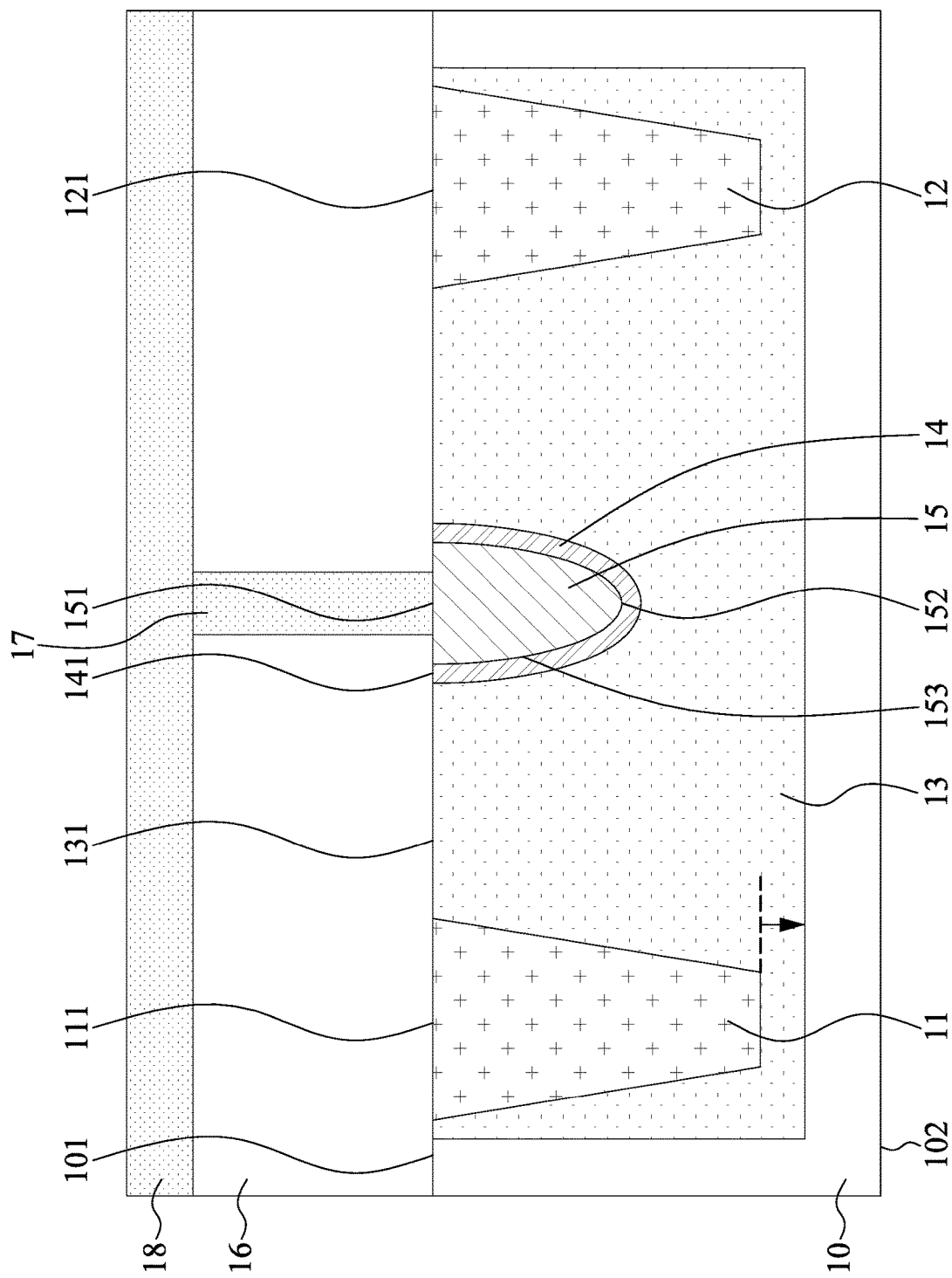
FIG. 1 is a schematic cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor device 1 in accordance with some embodiments of the present disclosure.

In some embodiments, the semiconductor device 1 may be disposed adjacent to a circuit. For example, the semiconductor device 1 may be disposed adjacent to a memory device such as a dynamic random access memory (DRAM) device or the like. In some embodiments, the semiconductor device 1 may include a fuse array structure or be a part of the fuse array structure. In some embodiments, the semiconductor device 1 may include a fuse component. As used herein, the term "fuse component" refers to a semiconductor device functioning as an antifuse, which is a normally an open circuit that can be blown to become a short circuit when a voltage is applied.

As shown in FIG. 1, in some embodiments, the semiconductor device 1 may include a substrate 10, isolation structures 11, 12, an active region 13, a fuse dielectric layer 14, a gate metal layer 15, an interlayer dielectric layer 16, a conductive plug 17, and a conductive layer 18.

In some embodiments, the substrate 10 may include a surface 101 and a surface 102 opposite to the surface 101. In some embodiments, the surface 101 may be an active surface of the substrate 10 and the surface 102 may be a backside surface of the substrate 10.

In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate 10 may include a layered semiconductor such as silicon/silicon germanium, silicon-on-insulator, or silicon germanium-on-insulator.

In some embodiments, the isolation structures 11 and 12 may be disposed over or in the substrate 10. In some embodiments, the isolation structures 11 and 12 may be disposed in the active region 13. In some embodiments, the isolation structures 11 and 12 may include shallow trench isolation (STI) structures.

In some embodiments, the isolation structure 11 may have a surface (or a top surface) 111 substantially coplanar with the surface 101 of the substrate 10. Similarly, the isolation structure 12 may have a surface (or a top surface) 121 substantially coplanar with the surface 101 of the substrate 10. In some embodiments, the surface 111 and the surface 121 may be exposed from the substrate 10 (such as exposed from the surface 101 of substrate 10). In some embodiments, the surface 111 and the surface 121 may be exposed from the active region 13 (such as exposed from a surface 131 of the active region 13).

In some embodiments, the isolation structures 11 and 12 may each include an insulating material such as silicon oxide ($SiO_2$), silicon nitride ($Si_3N_4$), silicon oxynitride ($N_2OSi_2$), silicon nitride oxide ($N_2OSi_2$), or fluorine-doped silica. In some embodiments, the isolation structures 11 and 12 may define one or more active areas or active regions of the substrate 10.

In some embodiments, the active region 13 may be disposed over or in the substrate 10. In some embodiments, the active region 13 may be disposed over or proximal to the surface 101 of the substrate 10. In some embodiments, the active region 13 may have a surface (or a top surface) 131 exposed from the surface 101 of the substrate 10. In some embodiments, the surface 131 of the active region 13 may be substantially coplanar with the surface 101 of the substrate 10. In some embodiments, the active region 13 may be disposed between the isolation structures 11 and 12. For example, a part of the active region 13 may be disposed between the isolation structures 11 and 12.

In some embodiments, the active region 13 may be doped with an N-type dopant such as phosphorus (P), arsenic (As), or antimony (Sb). In some other embodiments, the doped region 13 may be doped with a P-type dopant such as boron (B) or indium (In). In some embodiments, the substrate 10 may be or include an unimplanted area. In some embodiments, the active region 13 may have a higher doping concentration than the substrate 10.

In some embodiments, the active region 13 may include a substantially constant doping concentration. For example, the fuse dielectric layer 14 may be surrounded by the active region 13 with a substantially constant or uniform doping concentration. In some embodiments, a doping concentration of the active region 13 between the isolation structure 11 and the fuse dielectric layer 14 may be substantially constant or uniform. In some embodiments, a doping concentration of the active region 13 between the isolation structure 12 and the fuse dielectric layer 14 may be substantially constant or uniform. In other words, the doping concentration around the fuse dielectric layer 14 may be substantially constant or uniform.

In some embodiments, the active region 13 may include a step, gradient, or other doping profile. For example, the active region 13 may include a gradually changing doping concentration. For example, the doping concentration of the active region 13 may gradually decrease toward the surface 102 of the substrate 10. Therefore, in some embodiments, the fuse dielectric layer 14 may be surrounded by the active region 13 with a step, gradient, or other doping profile. For example, in some embodiments, a doping concentration of the active region 13 between the isolation structure 11 and the fuse dielectric layer 14 may be substantially gradient. In some embodiments, a doping concentration of the active region 13 between the isolation structure 12 and the fuse dielectric layer 14 may be substantially gradient.

According to some embodiments of the present disclosure, the fuse component (including the active region 13, the fuse dielectric layer 14, and the gate metal layer 15) may have a structure different from a transistor, such as a metal-oxide-semiconductor field-effect transistor (MOSFET) or a metal-insulator-semiconductor field-effect transistor (MISFET). For example, the fuse component may not be or include a transistor. For example, the fuse component may be surrounded by a doped region (such as the active region 13) with a uniform, step, gradient, or other doping profile. For example, the fuse component may not have two additional terminals (i.e., a source and a drain), each connected to individual highly doped regions that are separated by the body region (such as a bulk substrate). For example, the fuse component may not have a depletion region extending between the source and the drain. For example, the fuse component may not have a conducting channel extending between the source and the drain.

In some embodiments, the fuse dielectric layer 14 may be disposed in the active region 13. In some embodiments, the fuse dielectric layer 14 may be at least partially surrounded by the active region 13. In some embodiments, the fuse dielectric layer 14 may at least partially penetrate or extend into the active region 13. In some embodiments, the fuse dielectric layer 14 may extend from the surface 131 of the active region 13 into the active region 13. In some embodiments, the active region 13 may include a recess (such as the recess region 13r in FIG. 6B) indented or recessed into the substrate 10, and the fuse dielectric layer 14 may be disposed in the recess.

In some embodiments, the fuse dielectric layer 14 may have a surface (or a top surface) 141 exposed from the surface 131 of the active region 13. In some embodiments, the surface 141 of the fuse dielectric layer 14 may be substantially coplanar with the surface 131 of the active region 13.

In some embodiments, the fuse dielectric layer 14 may include a silicon oxide ($SiO_2$), metal oxides or the like.

In some embodiments, the fuse dielectric layer 14 may be formed during a manufacturing process of, for example, a gate dielectric layer of a buried-gate structure of an adjacent circuit. In such embodiments, the fuse dielectric layer 14 may include a material the same as the gate dielectric layer, such as hafnium oxide ($HfO_2$), hafnium silicate ($HfSiO_4$), lanthanum oxide ($La_2O_3$), lanthanum aluminum oxide ($LaAlO_3$), zirconium oxide ($ZrO_2$), zirconium silicate ($ZrSiO_4$), aluminum oxide ($Al_2O_3$), other high-k materials, or a combination thereof.

In some embodiments, the gate metal layer 15 may be disposed in the active region 13. In some embodiments, the gate metal layer 15 may be at least partially surrounded by the fuse dielectric layer 14 and further surrounded by the active region 13. In some embodiments, the gate metal layer 15 may at least partially penetrate or extend into the fuse dielectric layer 14. In some embodiments, the gate metal layer 15 may extend from the surface 141 of the fuse dielectric layer 14 into the fuse dielectric layer 14. In some embodiments, fuse dielectric layer 14 may include a recess (such as the recess region 13r in FIG. 6B and FIG. 6C) indented or recessed into the substrate 10, and the gate metal layer 15 may be disposed in the recess.

In some embodiments, the gate metal layer 15 may have a surface (or a top surface) 151 facing away from the substrate 10, a surface (or a bottom surface) 152 opposite to the surface 151, and a lateral surface 153 extending between the surface 151 and the surface 152.

In some embodiments, the surface 151 of the gate metal layer 15 may be exposed from the surface 131 of the active region 13. In some embodiments, the surface 151 of the gate metal layer 15 may be substantially coplanar with the surface 131 of the active region 13. In some embodiments, the surface 151 of the gate metal layer 15 may be substantially coplanar with the surface 141 of the fuse dielectric layer 14.

In some embodiments, the surface 152 of the gate metal layer 15 may face the substrate 10. In some embodiments, the surface 152 of the gate metal layer 15 may include, but is not limited to, a bowl-shaped profile, a U-shaped profile, or another feasible profile.

In some embodiments, the surface 153 of the gate metal layer 15 may be non-parallel to or angled with the surface 101 of the substrate 10. In some embodiments, the surface 153 of the gate metal layer 15 may be non-parallel to or angled with the surface 131 of the active region 13. In some embodiments, the surface 153 of the gate metal layer 15 may be surrounded by the fuse dielectric layer 14. In some embodiments, the surface 153 of the gate metal layer 15 may be covered by the fuse dielectric layer 14. In some embodiments, the surface 153 of the gate metal layer 15 may contact (such as directly contact) the fuse dielectric layer 14.

In some embodiments, the gate metal layer 15 may be disposed adjacent to the isolation structure 11 and/or the isolation structure 12. In some embodiments, the surface 153 of the gate metal layer 15 may face the isolation structures 11 and 12.

In some embodiments, the gate metal layer 15 may include polycrystalline silicon (poly-Si), titanium nitride (TiN), tungsten (W), or the like. In some embodiments, the gate metal layer 15 may be formed during a manufacturing process of, for example, a gate electrode of a buried-gate structure of an adjacent circuit. In such embodiments, the fuse dielectric layer 14 may include a material which is the same as that of the gate electrode.

In some embodiments, the interlayer dielectric layer 16 may be disposed on the substrate 10 and contact a part of the surface 101 of the substrate 10. In some embodiments, the interlayer dielectric layer 16 may contact the surface 111 of the isolation structure 11 and the surface 121 of the isolation structure 12. In some embodiments, the interlayer dielectric layer 16 may contact the surface 131 of the active region 13. In some embodiments, the interlayer dielectric layer 16 may contact the surface 141 of the fuse dielectric layer 14. In some embodiments, the interlayer dielectric layer 16 may contact the surface 151 of the gate metal layer 15.

In some embodiments, the interlayer dielectric layer 16 may include a suitable dielectric material. For example, the interlayer dielectric layer 16 may include silicon nitride ($Si_3N_4$), silicon oxynitride ($N_2OSi_2$), silicon nitride oxide ($N_2OSi_2$), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof.

In some embodiments, the conductive plug 17 may penetrate or extend into the interlayer dielectric layer 16. In some embodiments, the conductive plug 17 may be disposed on the surface 151 of the gate metal layer 15. In some embodiments, the conductive plug 17 may be in contact with the surface 151 of the gate metal layer 15. For example, a part of the surface 151 of the gate metal layer 15 may be covered by the conductive plug 17, and another part of the surface 151 of the gate metal layer 15 may be covered by the interlayer dielectric layer 16. In some embodiments, the conductive plug 17 may be electrically connected with the gate metal layer 15.

In some embodiments, the conductive plug 17 may include a suitable conductive material. For example, the conductive plug 17 may include tungsten (W), copper (Cu), aluminum (Al), silver (Ag), an alloy thereof, or a combination thereof.

In some embodiments, the conductive layer 18 may be disposed on the interlayer dielectric layer 16 and electrically connected with the conductive plug 17.

In some embodiments, the conductive layer 18 may include a suitable conductive material. For example, the conductive layer 18 may include tungsten (W), copper (Cu), aluminum (Al), silver (Ag), an alloy thereof, or a combination thereof. In some embodiments, the conductive layer 18 and the conductive plug 17 may include the same conductive material. In some embodiments, the conductive layer 18 and the conductive plug 17 may include different conductive materials.

Figure 2:
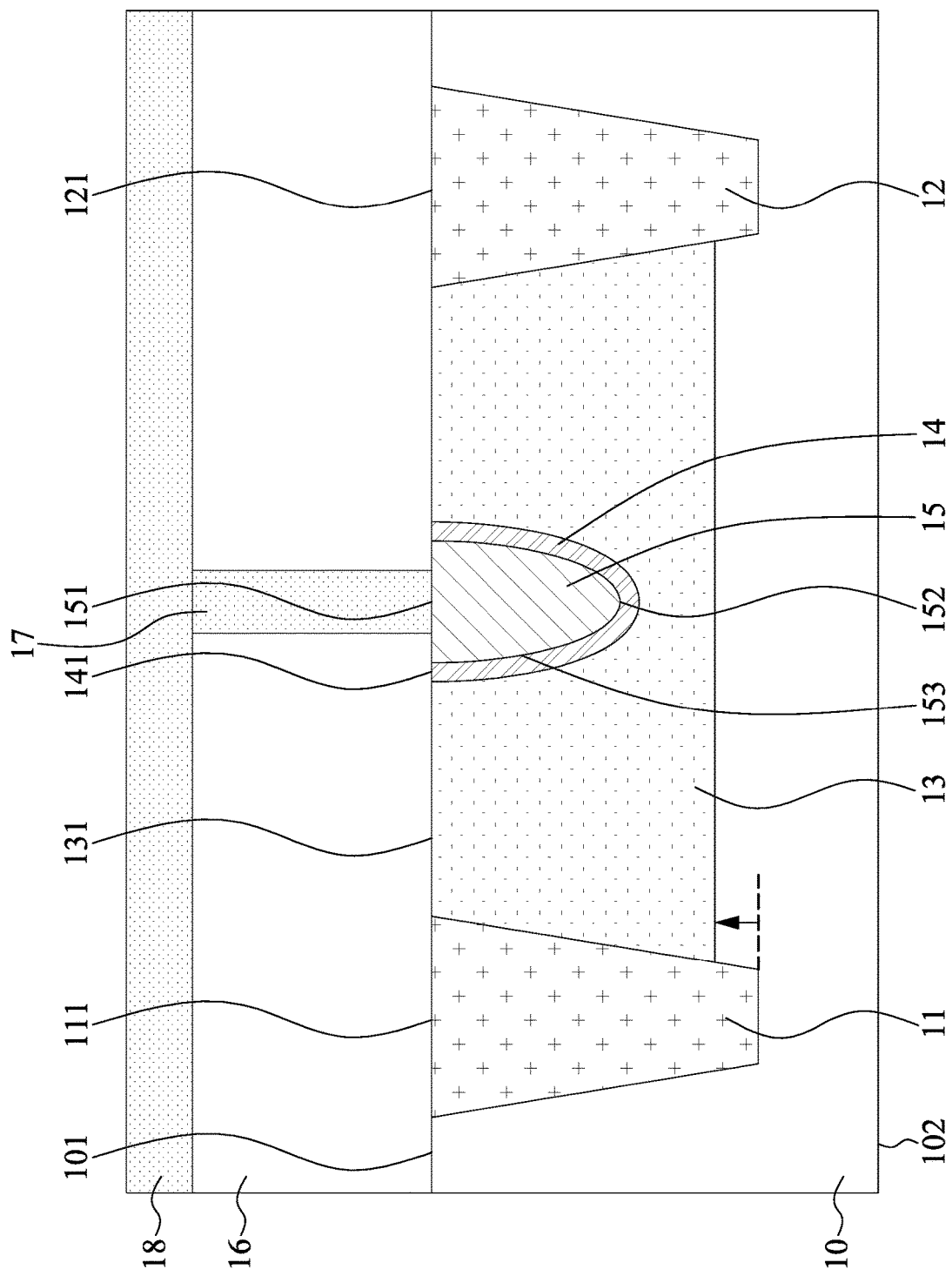
FIG. 2 is a schematic cross-sectional view of a semiconductor device in accordance with some embodiments of the present disclosure.

FIG. 2 is a schematic cross-sectional view of a semiconductor device 2 in accordance with some embodiments of the present disclosure. The semiconductor device 2 of FIG. 2 is similar to the semiconductor device 1 of FIG. 1, except for the differences described below.

In some embodiments, as shown in FIG. 1, the active region 13 may be deeper than the isolation structures 11 and 12. For example, the bottoms of the isolation structures 11 and 12 are covered or surrounded by the active region 13. However, in some other embodiments, as shown in FIG. 2, the isolation structures 11 and 12 may exceed the active region 13 and extend into the substrate 10.

In some embodiments, the doping depth of the active region 13 may be adjusted to fit the applications employing the semiconductor device 2. For example, the doping depth of the active region 13 may be shallower than the isolation structures 11 and 12 but deeper than the fuse dielectric layer 14 so as to cover or surround the fuse dielectric layer 14.

Figure 3:
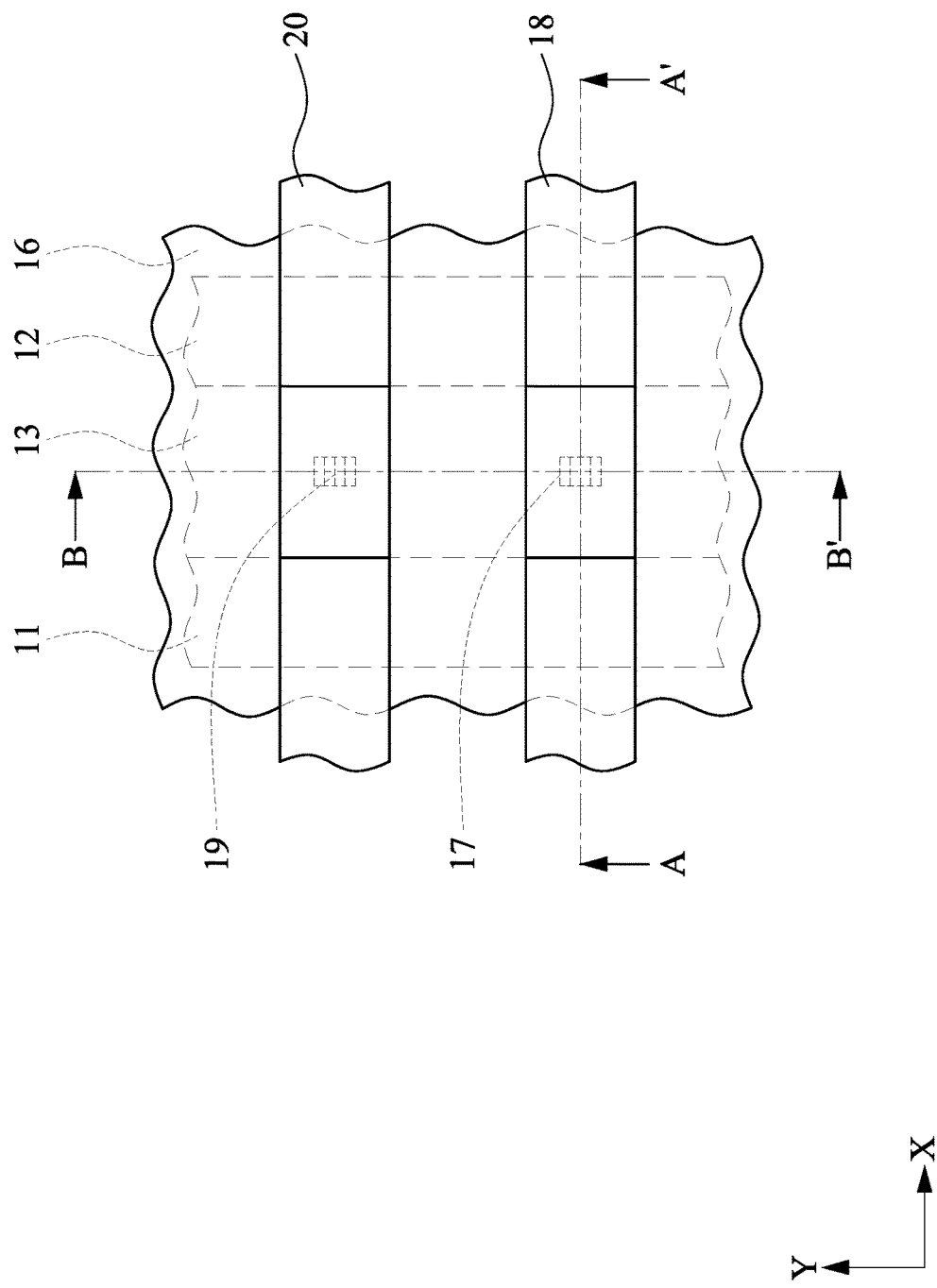
FIG. 3 illustrates a schematic top view of a semiconductor device in accordance with some embodiments of the present disclosure.

FIG. 3 illustrates a schematic top view of a semiconductor device 3 in accordance with some embodiments of the present disclosure. In some embodiments, the semiconductor device 1 of FIG. 1 and the semiconductor device 2 of FIG. 2 may be schematic cross-sectional views cutting through line AA' in FIG. 3.

As shown in FIG. 3, the isolation structures 11 and 12 may be formed as a strip-like configuration extending over the substrate (not shown in FIG. 3, such as the substrate 10 in FIG. 1) along a first direction, such as the direction Y shown in FIG. 3. Similarly, the active region 13 may be formed as a strip-like configuration extending over the substrate (not shown in FIG. 3, such as the substrate 10 in FIG. 1) along the direction Y shown in FIG. 3. The active region 13 may be disposed between the isolation structures 11 and 12.

The conductive layers 18 and 20 may be formed as a strip-like configuration extending over the interlayer dielectric layer 16 along a second direction, such as the direction X shown in FIG. 2. In some embodiments, the conductive layer 18 may be formed over the conductive plug 17 and electrically connected to the gate metal layer (not shown in FIG. 3, such as the gate metal layer 15 in FIG. 1). In some embodiments, the conductive layer 20 may be formed over a conductive plug 19 and electrically connected to the active region 13.

In some embodiments, the conductive plug 19 may be similar to the conductive plug 17. In some embodiments, the conductive layer 20 may be similar to the conductive layer 18.

In some embodiments, the conductive layers 18 and 20 may be bit lines and/or word lines or be a part of bit lines and/or word lines arranged in rows and columns. In some embodiments, the bit lines and/or word lines arranged in rows and columns may be substantially orthogonally arranged. For example, the bit lines may be substantially orthogonal to the word lines. In some embodiments, the bit lines may be electrically isolated from each other. In some embodiments, the word lines may be electrically isolated from each other.

Figure 4:
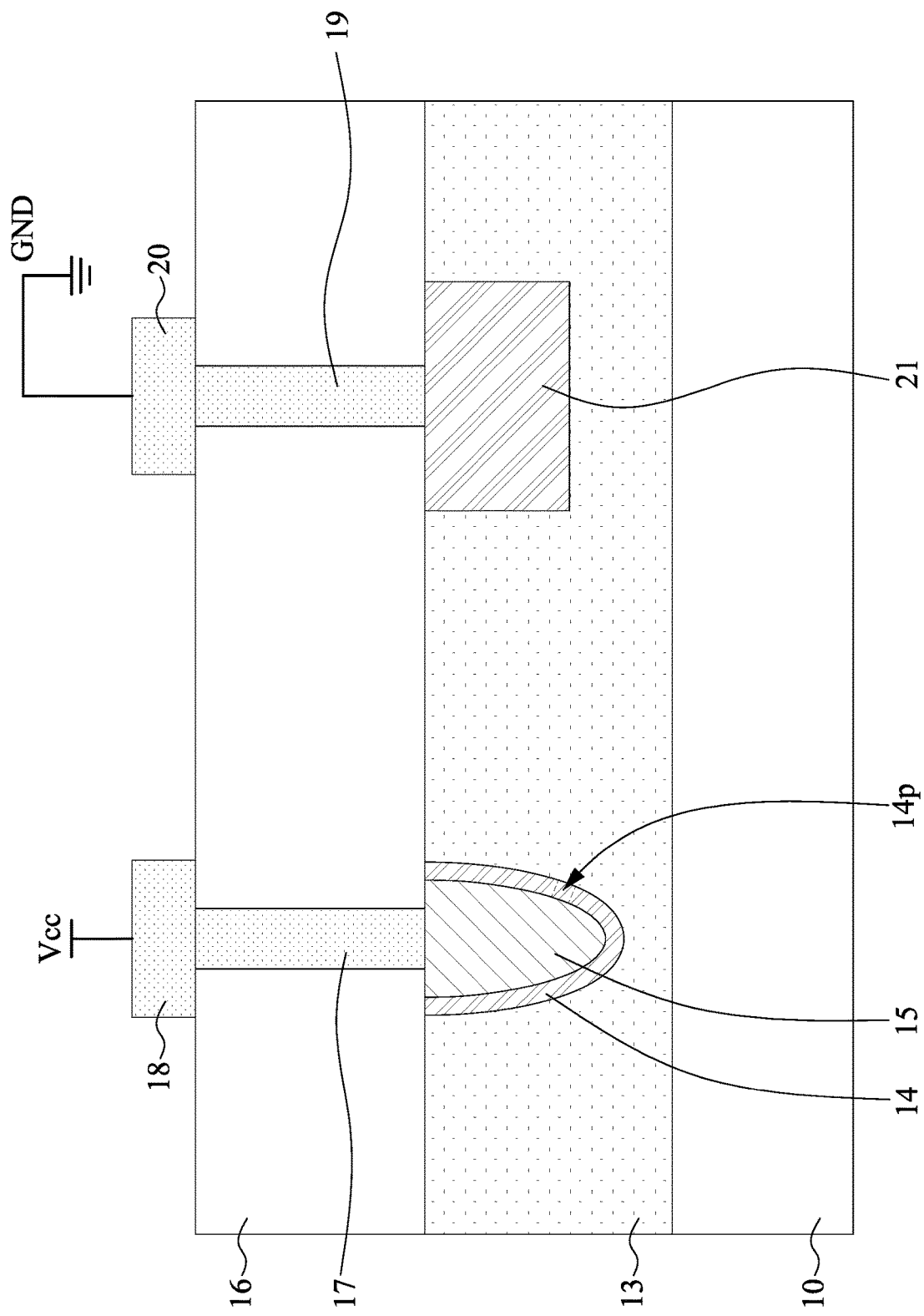
FIG. 4 is a schematic cross-sectional view of a semiconductor device in accordance with some embodiments of the present disclosure.

FIG. 4 is a schematic cross-sectional view of a semiconductor device 4 in accordance with some embodiments of the present disclosure. In some embodiments, the semiconductor device 4 of FIG. 4 may be a schematic cross-sectional view cutting through line BB' in FIG. 3.

As shown in FIG. 4, the semiconductor device 4 includes a doped region 21 in the active region 13. In some embodiments, the doped region 21 may have a depth that is less or shallower than a depth of the active region 13. For example, the doped region 21 may be located within the active region 13. In some embodiments, the conductive plug 19 may be disposed on the doped region 21. In some embodiments, the conductive plug 19 and the doped region 21 may form a low resistance ohmic contact.

In some embodiments, the doped region 21 and the active region 13 may be doped with different dopants. For example, the doped region 21 may be a P-doped region, with the active region 13 being an N-doped region. For example, the doped region 21 may be an N-doped region, with the active region 13 being a P-doped region.

In some embodiments, the doped region 21 may be omitted. For example, the conductive plug 19 may be disposed on the active region 13.

In some embodiments, the gate metal layer 15 may be connected or coupled to a voltage Vcc (e.g., a pumped voltage, a programming power voltage, a bias voltage, etc.). In some embodiments, the active region 13 may be grounded or held at the substrate potential. In some embodiments, when the voltage exceeds a threshold value (e.g., a breakdown voltage), the semiconductor device 4 may be activated. For example, a conductive path 14p across the fuse dielectric layer 14 may be formed, thereby causing an open circuit in the semiconductor device 4 to become a short circuit or a relatively low resistance link or node.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In some embodiments, the fuse dielectric layer 14 may undergo a dielectric breakdown process or a transformation of properties after the breakdown voltage is applied between the gate metal layer 15 and the active region 13. In some embodiments, the fuse dielectric layer 14 may be damaged. In some embodiments, the lattice structure of the fuse dielectric layer 14 may be changed. In some embodiments, a defect may be formed in the fuse dielectric layer 14. In some embodiments, the gate metal layer 15 and the active region 13 may be electrically connected through the fuse dielectric layer 14. In some embodiments, the conductivity of the fuse dielectric layer 14 may be increased by about 1000 times, by about 10000 times, or more after the breakdown voltage is applied between the gate metal layer 15 and the active region 13. In some embodiments, the resistivity of the fuse dielectric layer 14 may be decreased after the breakdown voltage is applied between the gate metal layer 15 and the active region 13.

It will be understood that the conductive path 14p across the fuse dielectric layer 14 is merely illustrated for a better understanding, and may not be observed when the breakdown voltage is applied.

In some embodiments, the voltage applied to the gate metal layer 15 may be controlled by a voltage controlled switch circuit, which may include, for example, one or more pass gates, one or more select gates, etc. According to some embodiments of the present disclosure, the select gates may be configured to select and control the pass gates. For example, the pass gates may be controlled by a logic signal, which can be output from the select gates.

Figure 5:
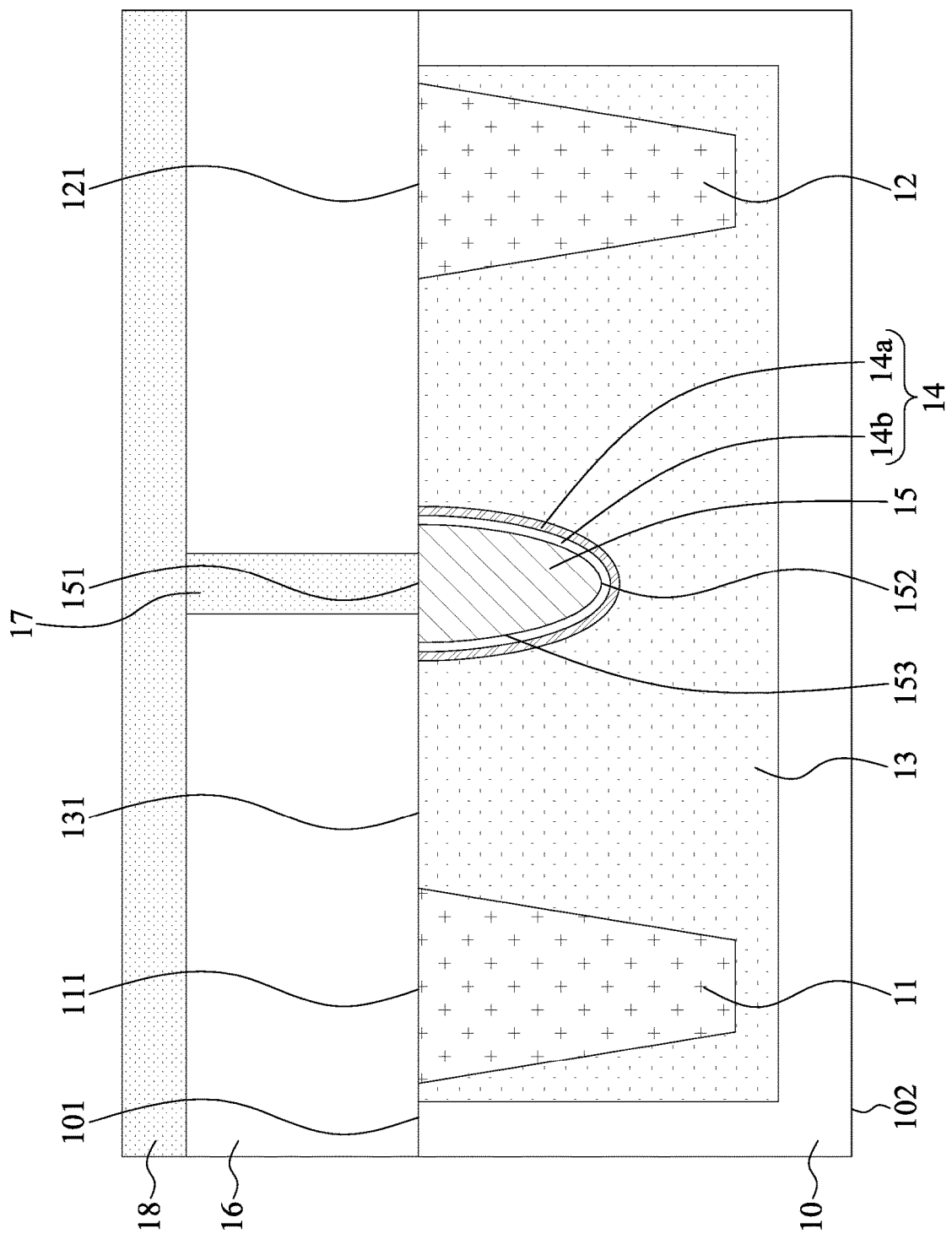
FIG. 5 is a schematic cross-sectional view of a semiconductor device in accordance with some embodiments of the present disclosure.

FIG. 5 is a schematic cross-sectional view of a semiconductor device 5 in accordance with some embodiments of the present disclosure. The semiconductor device 5 of FIG. 5 is similar to the semiconductor device 1 of FIG. 1, except for the differences described below.

In some embodiments, as shown in FIG. 1, the fuse dielectric layer 14 may include a monolayer or a single layer. However, in some other embodiments, as shown in FIG. 5, the fuse dielectric layer 14 may include a plurality of dielectric layers stacked on one another. For example, in some embodiments, the active region 13 may include a recess indented or recessed into the substrate 10, and the fuse dielectric layers 14a and 14b may be disposed in the recess. In some embodiments, the dielectric layer 14b may be disposed on the dielectric layer 14a. In some embodiments, the dielectric layer 14b may be disposed between the dielectric layer 14a and the gate metal layer 15. In some embodiments, the dielectric layer 14a may be in contact with (such as in direct contact with) the active region 13. In some embodiments, the dielectric layer 14b may be in contact with (such as in direct contact with) gate metal layer 15.

In some embodiments, the dielectric layers 14a and 14b may have the same material but be formed in different operations. In some embodiments, the dielectric layers 14a and 14b may have different materials. In some embodiments, the dielectric layers 14a and 14b may be adjusted to obtain different dielectric break-down characteristics according to some embodiments of the present disclosure.

In a comparative embodiment, a fuse component may include a metal-oxide-semiconductor structure (i.e., a MOS structure). The MOS structure is a planar structure (or a two-dimensional (2D) structure), in which a planar metal layer and a planar oxide layer are stacked on an active area. Such a planar structure occupies a larger area on the semiconductor substrate. As semiconductor devices become more highly integrated, fuse components with favorable size and breakdown conditions are required.

By forming a fuse component having a three-dimensional (3D) structure, the area occupied by the fuse component of the present disclosure is increasingly reduced. For example, the overlay area between the active region 13 and the gate metal layer 15 may be decreased by more than 40 times, i.e., decreased from about 160 nanometers (nm)*120 nm to about 26 nm*17 nm.

In addition, the overlapping perimeter between the active region 13 and the gate metal layer 15 of the fuse component 1 (or the fuse component 2, the fuse component 3, the fuse component 4, the fuse component 5) of the present disclosure can be increased without further occupying other areas. The longer overlapping perimeter can reduce the breakdown voltage, and therefore increases the probability of successful fusing of the fuse component 1 of the present disclosure.

FIGS. 6A, 6B, 6C, 6D, 6E, and 6F illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIG. 1 may be manufactured by the operations described below with respect to FIGS. 6A, 6B, 6C, 6D, 6E, and 6F.

Figure 6A:
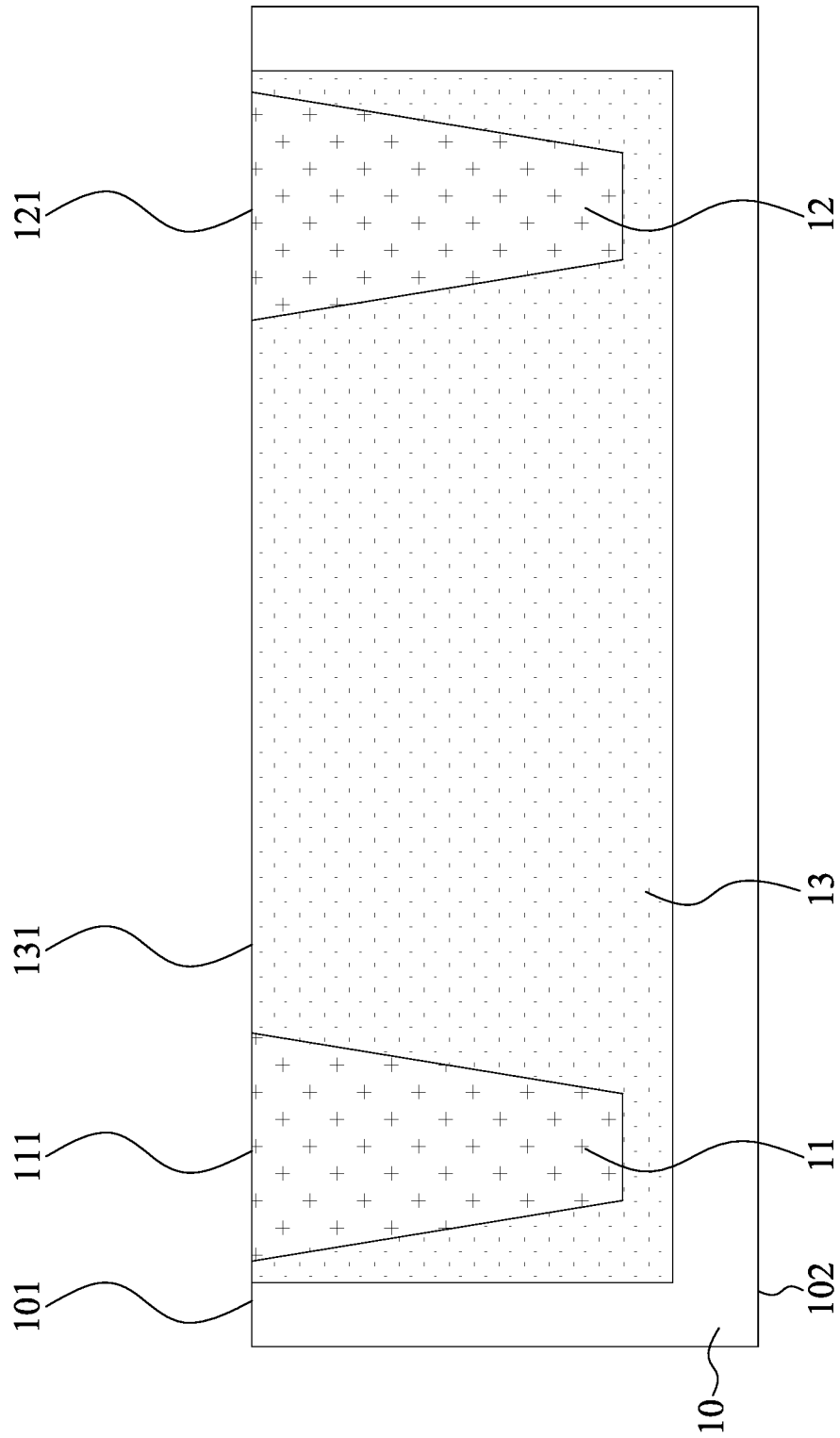
FIG. 6A illustrates one or more stages of a method of manufacturing a semiconductor device in accordance with some embodiments of the present disclosure.

Referring to FIG. 6A, the substrate 10 may be provided. The isolation structures 11 and 12 may be disposed over or in the substrate 10. The active region 13 may be defined by the isolation structures 11 and 12. In some embodiments, the isolation structures 11 and 12 may be formed by trench etching followed by filling a dielectric material in the trench. In some embodiments, the active region 13 may be formed by doping impurities through ion-implantation or thermal diffusion. In some embodiments, the active region 13 may be formed over or proximal to the surface 101 of the substrate 10. In some embodiments, the active region 13 may be formed after the formation of the isolation structures 11 and 12. In some other embodiments, the active region 13 may be formed before the formation of the isolation structures 11 and 12.

Figure 6B:
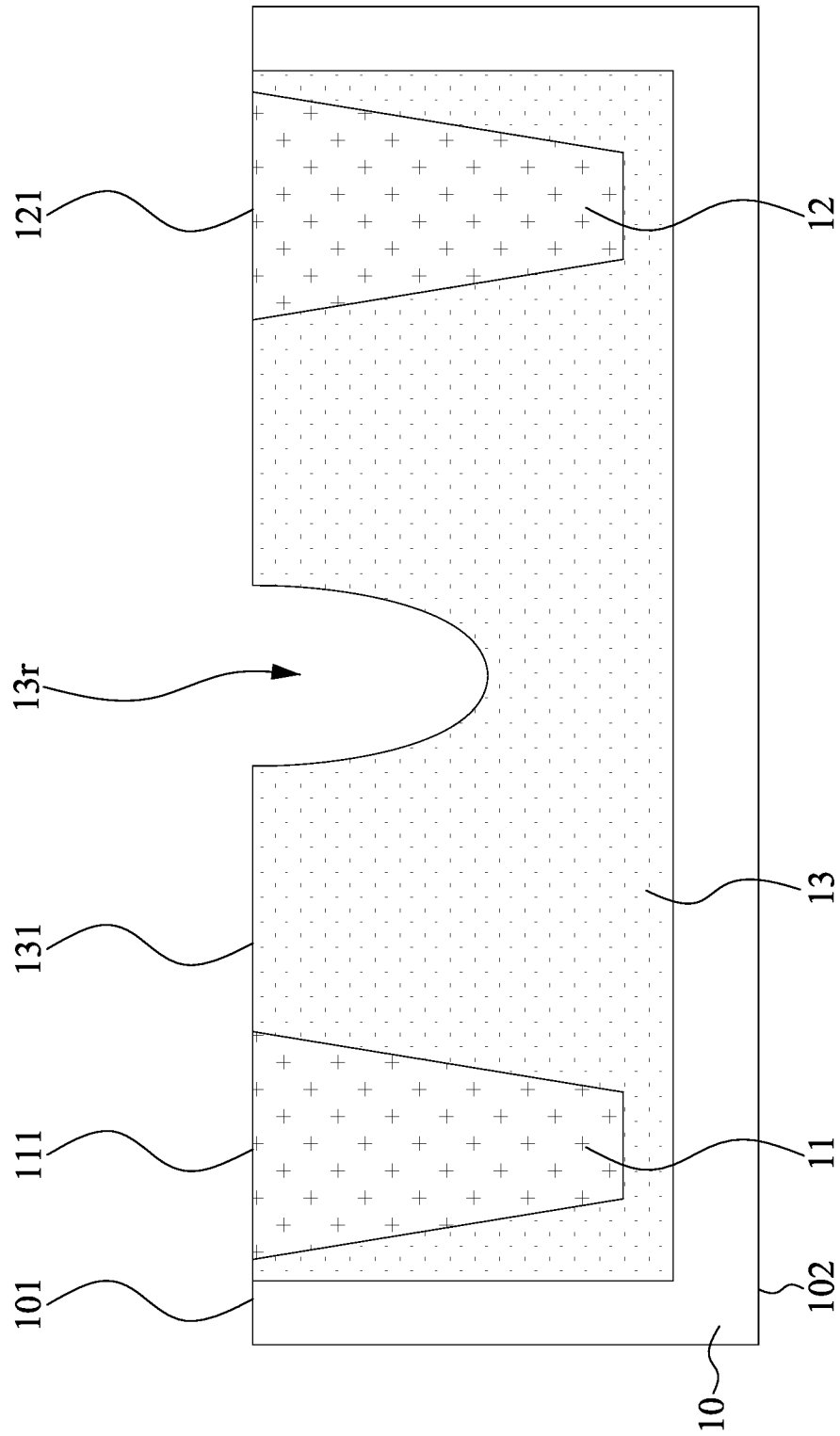
FIG. 6B illustrates one or more stages of a method of manufacturing a semiconductor device in accordance with some embodiments of the present disclosure.

Referring to FIG. 6B, a recess region 13r may be formed in the active region 13. In some embodiments, the recess region 13r may be formed by lithography and etching techniques. In some embodiments, the recess region 13r may have a depth shallower than that of the active region 13. In some embodiments, the recess region 13r may have a depth shallower than that of the isolation structures 11 and 12. In some embodiments, the recess region 13r may be formed in a way such that the substrate 10 is not exposed through the recess region 13r.

Figure 6C:
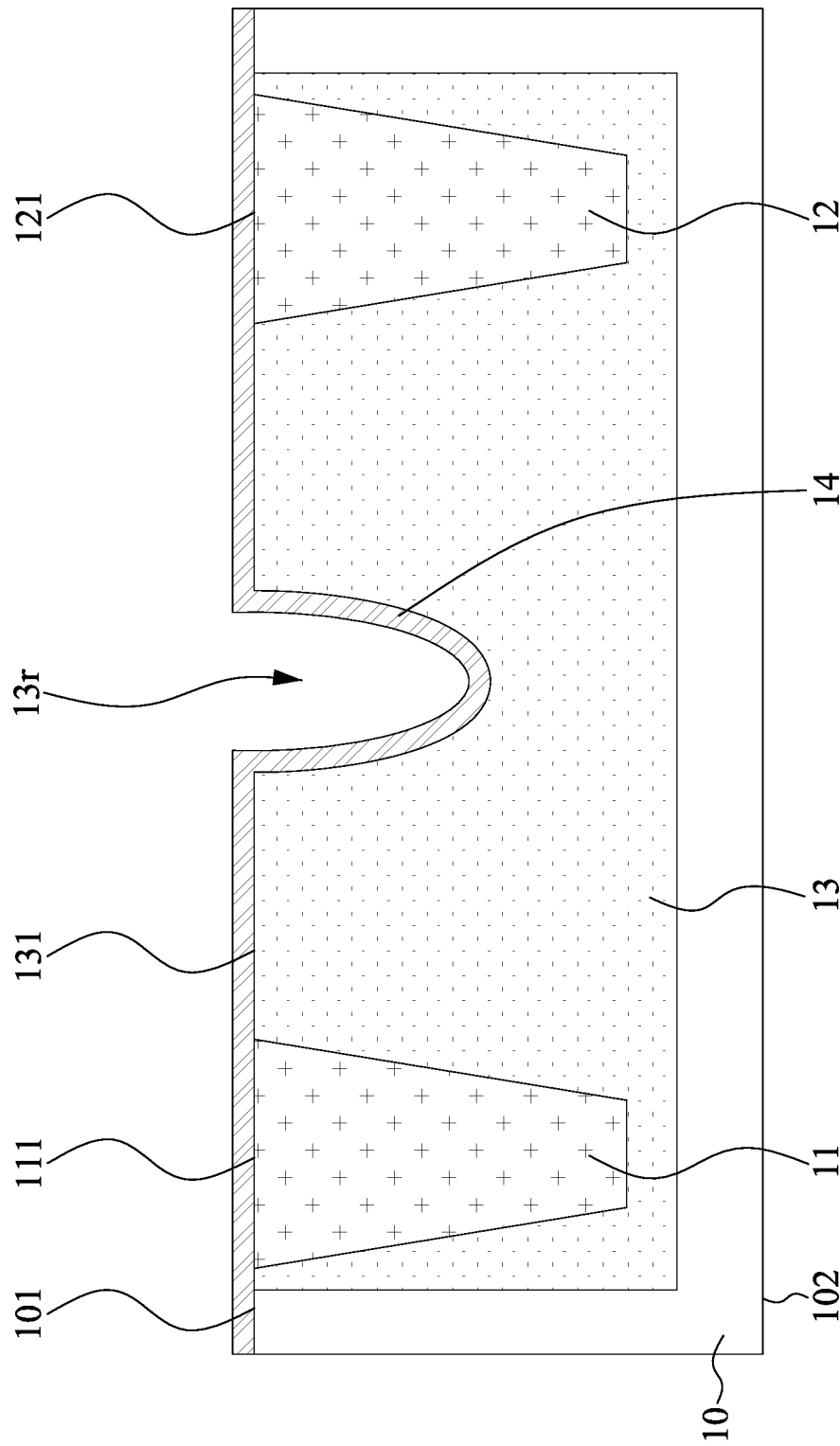
FIG. 6C illustrates one or more stages of a method of manufacturing a semiconductor device in accordance with some embodiments of the present disclosure.

Referring to FIG. 6C, the fuse dielectric layer 14 may be disposed in the recess region 13r in the active region 13. In some embodiments, the fuse dielectric layer 14 may be formed by a thermal oxidation operation. In some embodiments, the fuse dielectric layer 14 may be formed by an atomic layer deposition (ALD) process, a chemical vapor deposition (CVD) process, or a combination thereof. For example, the fuse dielectric layer 14 may be formed by forming a layer through an ALD process, then forming another layer through a CVD process. In some embodiments, the fuse dielectric layer 14 may be disposed on the surface 131 of the active region 13, the surface 121 of the isolation structure 12, the surface 111 of the isolation structure 11, and/or the surface 101 of the substrate 10.

Figure 6D:
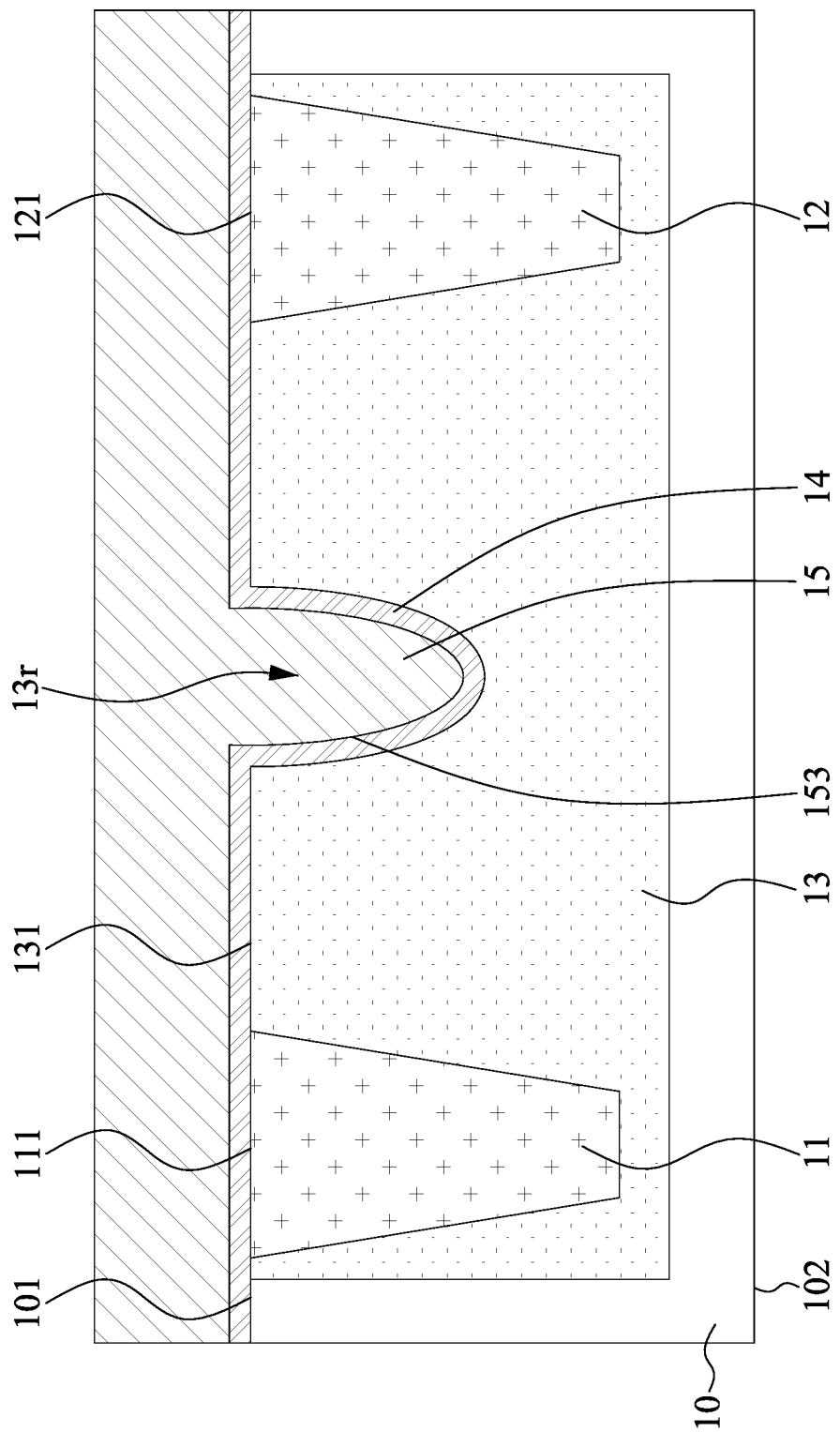
FIG. 6D illustrates one or more stages of a method of manufacturing a semiconductor device in accordance with some embodiments of the present disclosure.

Referring to FIG. 6D, a gate metal material may be disposed to fill the recess region 13r in the active region 13 by, for example, CVD, low pressure chemical vapor deposition (LPCVD), forming the gate metal layer 15. The surface 153 of the gate metal layer 15 may be non-parallel to or angled with the surface 101 of the substrate 10. In some embodiments, the surface 153 of the gate metal layer 15 may be surrounded by the fuse dielectric layer 14. In some embodiments, the surface 153 of the gate metal layer 15 may be covered by the fuse dielectric layer 14. In some embodiments, the surface 153 of the gate metal layer 15 may contact (such as directly contact) the fuse dielectric layer 14.

Figure 6E:
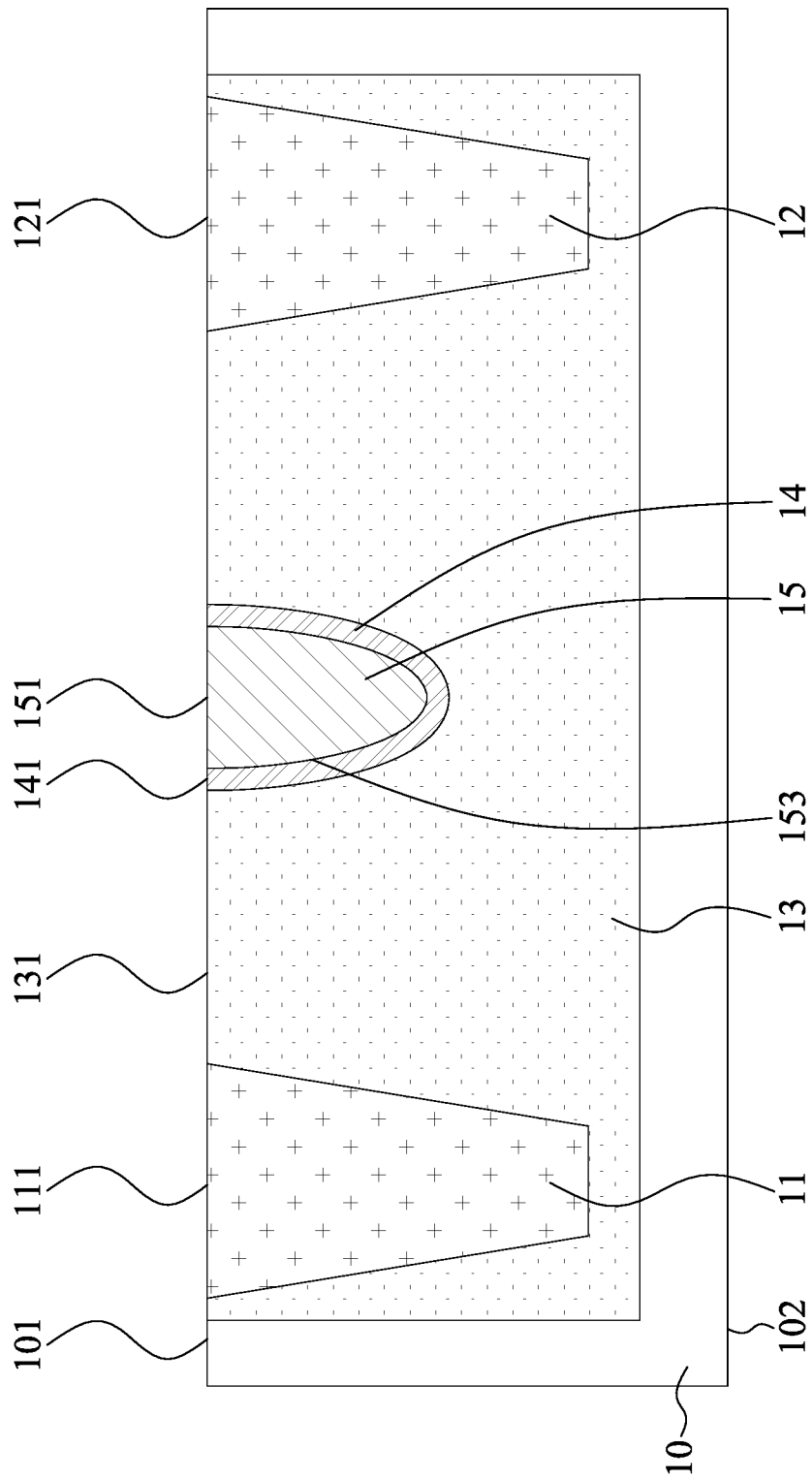
FIG. 6E illustrates one or more stages of a method of manufacturing a semiconductor device in accordance with some embodiments of the present disclosure.

Referring to FIG. 6E, a planarization operation, such as a chemical-mechanical polishing (CMP) operation, may be performed. After the planarization operation, the surface 151 of the gate metal layer 15, the surface 141 of the fuse dielectric layer 14, the surface 131 of the active region 13, the surface 121 of the isolation structure 12, the surface 111 of the isolation structure 11, and/or the surface 101 of the substrate 10 may be substantially coplanar.

Figure 6F:
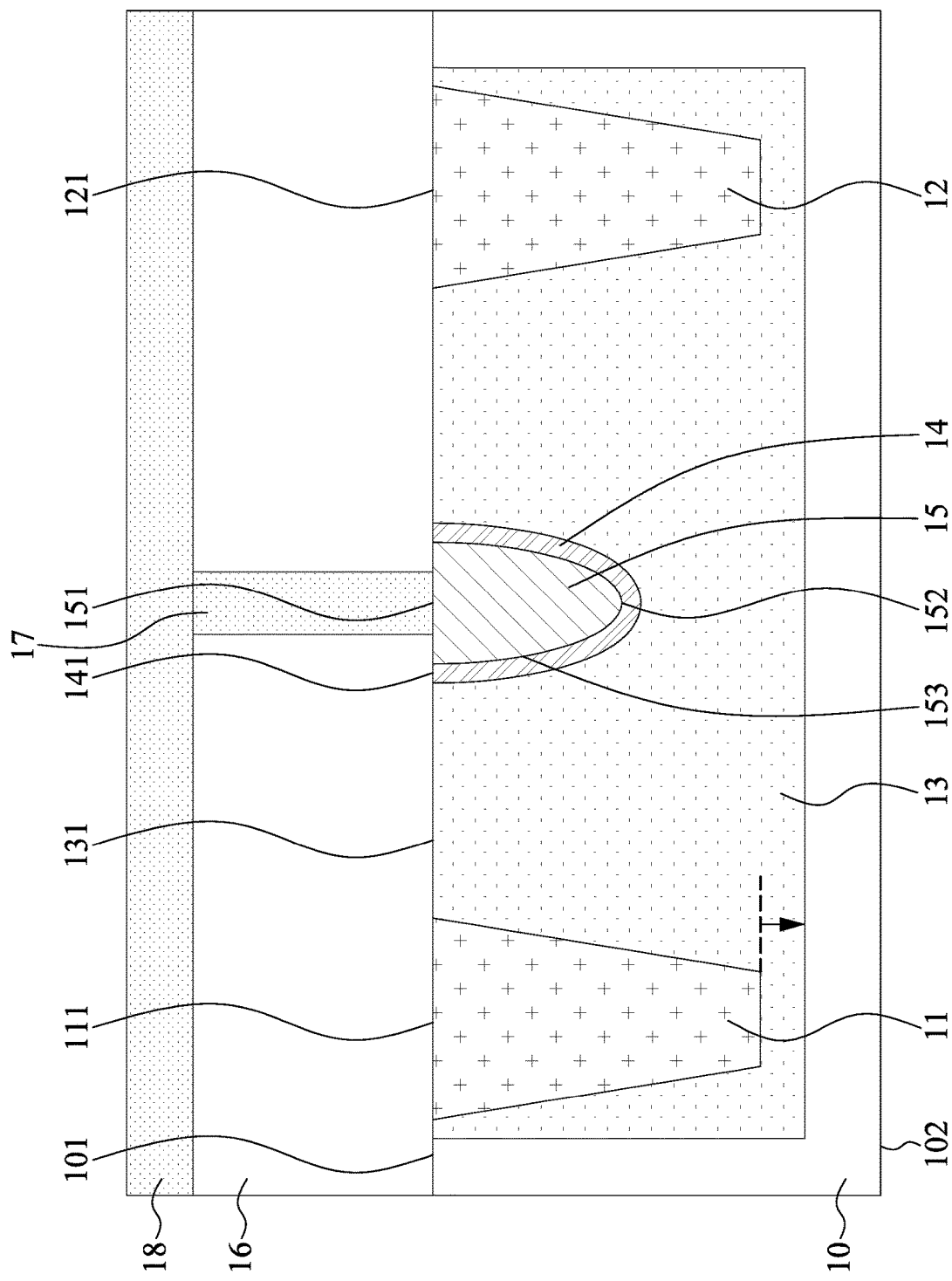
FIG. 6F illustrates one or more stages of a method of manufacturing a semiconductor device in accordance with some embodiments of the present disclosure.

Referring to FIG. 6F, the interlayer dielectric layer 16 may be disposed by, for example, ALD, CVD, physical vapor deposition (PVD), remote plasma CVD (RPCVD), plasma enhanced CVD (PECVD), coating, etc. An opening may be formed in the interlayer dielectric layer 16 by lithography and etching techniques. A conductive material of the conductive plug 17 may be formed in the opening in the interlayer dielectric layer 16. The conductive material may be formed by suitable techniques such as electroplating, or an electroless plating process, CVD, PVD, etc. Similar operations may be repeated to form the conductive layer 18 and other conductive elements (if any) over the conductive plug 17.

In some embodiments, subsequent to the formation of the conductive plug 17 and the conductive layer 18, the method may further include connecting the gate metal layer 15 to a power supply so as to apply a voltage to the gate metal layer 15 to cause an open circuit in the semiconductor device to become a short circuit or a relatively low resistance link or node.

In some embodiments, the operations described with respect to FIGS. 6A, 6B, 6C, 6D, 6E, and 6F may be performed concurrently during a manufacturing process of, for example, a buried-gate structure of an adjacent circuit. For example, the recess region 13r may be formed during a manufacturing process of, for example, a gate trench. For example, the fuse dielectric layer 14 may be formed during a manufacturing process of, for example, a gate dielectric layer of a buried-gate structure. For example, the gate metal layer 15 may be formed during a manufacturing process of, for example, a gate electrode of a buried-gate structure.

Figure 7:
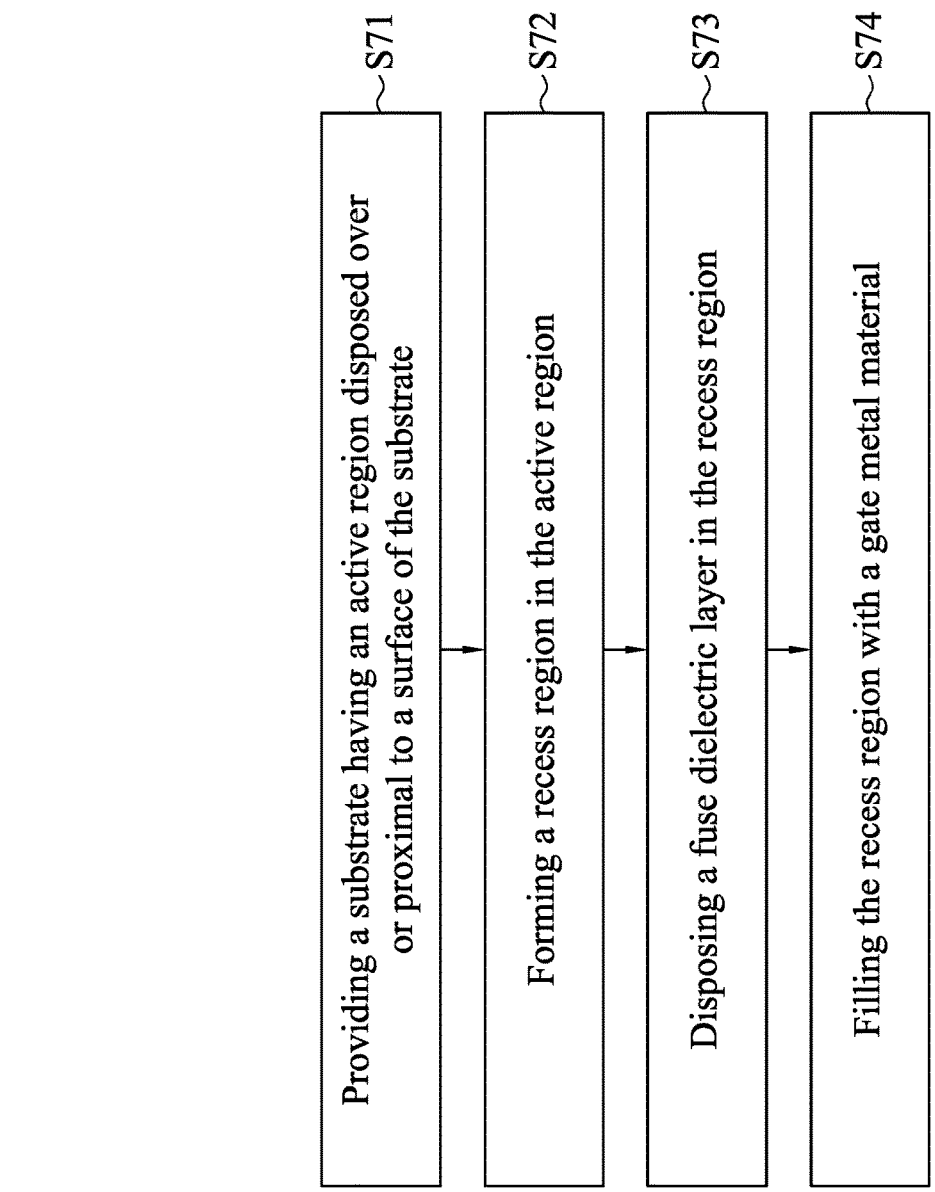
FIG. 7 illustrates a flow chart of a method of manufacturing a semiconductor device in accordance with some embodiments of the present disclosure.

FIG. 7 illustrates a flow chart of a method 70 of manufacturing a semiconductor device in accordance with some embodiments of the present disclosure.

In some embodiments, the method 70 may include a step S71, providing a substrate having an active region disposed over or proximal to a surface of the substrate. For example, as shown in FIG. 6A, the substrate 10 having the active region 13 disposed over or proximal to the surface 101 of the substrate 10 may be provided.

In some embodiments, the method 70 may include a step S72, forming a recess region in the active region. For example, as shown in FIG. 6B, the recess region 13r may be formed in the active region 13.

In some embodiments, the method 70 may include a step S73, disposing a fuse dielectric layer in the recess region. For example, as shown in FIG. 6C, the fuse dielectric layer 14 may be disposed in the recess region 13r.

In some embodiments, the method 70 may include a step S74, filling the recess region with a gate metal material. For example, as shown in FIG. 6D, a gate metal material may be disposed to fill the recess region 13r.

One aspect of the present disclosure provides a fuse component. The fuse component includes an active region having a surface, a fuse dielectric layer extending from the surface of the active region into the active region, and a gate metal layer surrounded by the fuse dielectric layer.

Another aspect of the present disclosure provides a semiconductor device. The semiconductor device includes an active region, a fuse dielectric layer disposed in the active region, and a gate metal layer disposed in the active region and surrounded by the fuse dielectric layer. The gate metal layer is configured to receive a voltage to change a resistivity between the gate metal layer and the active region.

Another aspect of the present disclosure provides a method of manufacturing a fuse component. The method includes an active region, forming a recess region in the active region, disposing a fuse dielectric layer in the recess region, and filling the recess region with a gate metal material.

By forming a fuse component having a three-dimensional (3D) structure, the area consumption of the fuse component of the present disclosure is increasingly reduced. The overlapping perimeter between the active region and the gate metal layer of the fuse component of the present disclosure can be increased without further occupying other areas. The longer overlapping perimeter can reduce the breakdown voltage, and therefore increases the probability of successful fusing of the fuse component of the present disclosure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate having an active region, wherein the active region is surrounded by the substrate at a position that a surface of the active region is coplanar with a top surface of the substrate;
   a fuse dielectric layer disposed in and in direct contact with the active region, wherein the fuse dielectric layer has a curved bottom surface positioned above a bottom surface of the active region and a top surface coplanar with the surface of the active region;
   a gate metal layer disposed in the active region and surrounded by the fuse dielectric layer, wherein the gate metal layer has a curved bottom surface and a top surface coplanar with the surface of the active region, such that the surface of the active region, the top surface of the fuse dielectric layer, the top surface of the gate metal layer, and the top surface of the substrate are coplanar with each other;
   an interlayer dielectric layer disposed on the substrate at a position that the surface of the active region, the top surface of the fuse dielectric layer, the top surface of the gate metal layer, and the top surface of the substrate are covered and are in direct contact with a bottom surface of the interlayer dielectric layer; and
   an isolation structure within the substrate, wherein the isolation structure has a top surface in direct contact with the bottom surface of the interlayer dielectric layer;
   wherein the gate metal layer is configured to receive a voltage to change a resistivity between the gate metal layer and the active region.

2. The semiconductor device of claim 1, wherein the gate metal layer is configured to electrically connect with the active region through the fuse dielectric layer in the case that the voltage is higher than a threshold voltage.

3. The semiconductor device of claim 1, wherein the gate metal layer has a lateral surface angled with the surface of the active region and contacting the fuse dielectric layer, wherein a width of the gate metal layer is gradually reduced from its top surface to its curved bottom surface.

4. The semiconductor device of claim 3, wherein the top surface of the gate metal layer is a flat surface coplanar with the top surface of the substrate and is in direct contact with the bottom surface of the interlayer dielectric layer.

5. The semiconductor device of claim 4, wherein the top surface of the fuse dielectric layer is a flat top surface coplanar with the top surface of the substrate.

6. The semiconductor device of claim 3, wherein the isolation structure is located within the active region, wherein the lateral surface of the gate metal layer faces the isolation structure, wherein a bottom surface of the isolation structure is positioned below the curved bottom surface of the fuse dielectric layer and above the bottom surface of the active region.

7. The semiconductor device of claim 6, wherein the top surface of the isolation structure is substantially coplanar with the surface of the active region, wherein the top surface of the isolation structure is covered and is in direct contact with the bottom surface of the interlayer dielectric layer.

8. The semiconductor device of claim 6, wherein a doping concentration of the active region between the isolation structure and the fuse dielectric layer is substantially uniform.

9. The semiconductor device of claim 3, wherein the isolation structure is located out of the active region, wherein the lateral surface of the gate metal layer faces the isolation structure, wherein a bottom surface of the isolation structure is positioned below the bottom surface of the active region.

10. The semiconductor device of claim 1, wherein the active region comprises a higher doping concentration than the substrate.

11. The semiconductor device of claim 1, further comprising:
  a conductive layer disposed on and in direct contact with the interlayer dielectric layer;
  a first conductive plug electrically connected with the gate metal layer and the conductive layer through the interlayer dielectric layer, wherein the first conductive plug has a top end coupling a bottom surface of the conductive layer and a bottom end coupling at the top surface of the gate metal layer; and
  a second conductive plug electrically connected with the active region.

12. The semiconductor device of claim 11, further comprising:
  a doped region in the active region, wherein the doped region and the active region are doped with different dopants and the second conductive plug is disposed over the doped region, wherein a width of the interlayer dielectric layer is equal to a height of the first conductive plug.

* * * * *